United States Patent [19]

Kadota et al.

[11] Patent Number: 5,714,830
[45] Date of Patent: Feb. 3, 1998

[54] FREE EDGE REFLECTIVE-TYPE SURFACE ACOUSTIC WAVE DEVICE

[75] Inventors: Michio Kadota, Kyoto; Naoki Mizoguchi, Takeru, both of Japan

[73] Assignee: Murata Manufacturing Co., Ltd., Japan

[21] Appl. No.: 590,331

[22] Filed: Jan. 23, 1996

[30] Foreign Application Priority Data

Jan. 24, 1995 [JP] Japan .................. 7-009251

[51] Int. Cl.⁶ .................................................. H01L 41/08
[52] U.S. Cl. ............................ 310/313 A; 310/313 B
[58] Field of Search ....................... 310/313 A, 313 R, 310/313 B, 313 C, 313 D, 334, 366

[56] References Cited

U.S. PATENT DOCUMENTS

| | | | |
|---|---|---|---|
| Re. 35,204 | 4/1996 | Lewis | 310/313 A |
| 3,680,009 | 7/1972 | Slobodnik et al. | 310/313 A |
| 4,016,440 | 4/1977 | Wagers | 310/313 A |
| 4,544,857 | 10/1985 | Shimizu et al. | 310/313 B |
| 5,260,913 | 11/1993 | Kadota et al. | 367/140 |

FOREIGN PATENT DOCUMENTS 569977  11/1993  European Pat. Off. .

OTHER PUBLICATIONS

Some Studies on Saw Resonators and Multiple-Mode Filters—Y. Suzuki, H. Shimizu, M. Takeuchi, K. Nakamura and A. Yamada—Faculty of Engineering, Tohoku University, Sendai, Japan—pp. 297–302.

*Primary Examiner*—Mark O. Budd
*Attorney, Agent, or Firm*—Ostrolenk, Faber, Gerb & Soffen, LLP

[57] ABSTRACT

A surface wave resonator suitable for use in the frequency band range of about 70 to 200 MHz has a wide frequency band characteristic. The resonator is a free edge reflective-type surface wave resonator having a pair of comb-like electrodes formed on the upper surface of a piezoelectric substrate made of 41° Y-cut X propagating piezoelectric single crystals of LiNbO₃, wherein SH-type leaky waves are reflected between two opposing free edges of the resonator.

1 Claim, 1 Drawing Sheet

5,714,830

FREE EDGE REFLECTIVE-TYPE SURFACE ACOUSTIC WAVE DEVICE

BACKGROUND OF THE INVENTION

1. Field of the Invention

The present invention relates to a free edge reflective-type surface acoustic wave (hereinafter referred to as "surface wave") device utilizing SH-type surface waves, and more particularly, to a free edge reflective-type surface wave resonator utilizing SH-type leaky waves as SH-type surface waves in order to widen the frequency band.

2. Description of the Related Art

Various types of surface wave resonators have been used as resonators for operating in the MHz frequency band. Some of the surface wave resonators utilizing the SH-type surface wave have been used as resonators having a wide frequency band. Like the BGS wave and the Love wave, the SH-type surface wave is a surface wave whose main component of displacement is along a direction perpendicular to the directions of propagation of the surface wave.

A conventional free edge reflective-type surface wave resonator utilizing the BGS wave has an interdigital transducer (hereinafter referred to as "IDT"), comprising a pair of comb-like electrodes, formed on a piezoelectric substrate made of a piezoelectric ceramic material such as lead titanate zirconate. Another conventional surface wave resonator utilizing the Love wave has an IDT made of gold (Au), formed by a pair of comb-like electrodes, located on a piezoelectric substrate made of Y-cut X-propagating single crystals of $LiNbO_3$.

However, the surface wave resonator utilizing the BGS wave, though having a wide frequency band, has a problem in that it has an upper resonance frequency limit of 70 MHz due to limitations in the frequency characteristics and grain size. The surface wave resonator utilizing the Love waves also has a problem in that comb-like electrodes made of Au cannot be formed to have a sufficiently large thickness due to higher costs and limitations in the IDT forming technique. Therefore, this type of resonator as a wide band resonator has a resonance frequency greater than 200 MHz.

Accordingly, none of the conventional surface wave resonators utilizing the SH-type surface waves are suitable for use in a frequency band having a range of about 70 to 200 MHz.

SUMMARY OF THE INVENTION

The preferred embodiments of the present invention provide a free edge reflective-type surface wave resonator suitable for use in a frequency band having a range of about 70 to 200 MHz and which exhibits resonance characteristics having a wide frequency band.

The preferred embodiments of the present invention also provide a free edge reflective-type surface wave resonator arranged to have SH-type surface waves reflected between two opposing free edges of a piezoelectric substrate, wherein a 41° Y-cut X-propagating piezoelectric substrate made of piezoelectric single crystals of $LiNbO_3$ is used as the piezoelectric substrate and leaky waves are used as the SH-type surface wave.

More specifically, the preferred embodiments of the present invention provide a free edge reflective-type surface wave resonator utilizing SH-type leaky waves, comprising a 41° Y-cut X-propagating piezoelectric substrate made of piezoelectric single crystals of $LiNbO_3$, the piezoelectric substrate having two opposing free edges and a pair of main surfaces connecting the two opposing free edges; and an interdigital transducer located on one of the main surfaces of the piezoelectric substrate and having a pair of comb-like electrodes with more than one electrode finger; wherein the electrode fingers of the pair of comb-like electrodes are arranged alternatingly with each other, with the outer edges of the electrode fingers on both sides of the directions of propagation of the surface wave extending on an upper main surface of the substrate along a length of the free edges of the piezoelectric substrate, the width of the electrode fingers on the both sides being substantially equal to ⅛ of the wavelength λ of the surface wave and the width of the remaining electrode fingers being substantially equal to ¼ of the wavelength of the surface wave.

A feature of the free edge reflective-type surface wave resonator of the preferred embodiments of the present invention is the use of a type of SH-type surface wave called a leaky wave. The leaky wave, also called a decaying elastic surface wave, radiates energy and thus is decayed as it propagates through the piezoelectric substrate. Therefore, it has been thought that leaky waves could not be used in a surface wave device because such leaky waves are decayed to a large extent.

A feature of the preferred embodiments of the present invention is the utilization of the leaky wave hitherto thought to be unusable in a surface wave device. In the free edge reflective-type surface wave resonator, an IDT is located on one of the main surfaces of the piezoelectric substrate joining the two opposing free edges. In the free edge reflective-type surface wave resonator, the entire surface wave propagation region allows development of surface waves by excitation, the region being located on one of the main surfaces of the piezoelectric substrate joining the two opposing free edges. Therefore, there are almost no portions of the region where the surface waves, developed by excitation, are decayed, during driving. Consequently, a resonator having excellent resonance characteristics with a satisfactory crest-to-trough ratio (that is, the ratio of the impedance value at the anti-resonance point with respect to the impedance value at the resonance point) can be produced, even with the use of leaky waves which are considerably decayed by radiation of energy. On the other hand, the piezoelectric substrate made of 41° Y-cut X-propagating piezoelectric single crystals of $LiNbO_3$ exhibits a large electromechanical coupling factor in the frequency band range of about 70 to 200 MHz. However, when the surface of the piezoelectric substrate is metalized, the propagation loss is relatively high at 0.044 dB/λ, so that formation of the IDT on the surface produces a leaky wave having the aforementioned propagation loss. For this reason, piezoelectric substrates made of 41° Y-cut X-propagating piezoelectric single crystals of $LiNbO_3$ were not hitherto used for surface wave devices such as surface wave filters or surface wave resonators.

The free edge reflective-type surface wave resonator of the preferred embodiments of the present invention is constructed to positively utilize the above-described leaky wave. This resonator, which is preferably formed by the 41° Y-cut X-propagating piezoelectric substrate made of piezoelectric single crystals of $LiNbO_3$, can have a wide frequency band of about 70 to 200 MHz, because the piezoelectric substrate has a high electromechanical coupling factor. As is clear, for example, from the preferred embodiments to be described below, it has been confirmed that the preferred embodiments of the present invention provide a resonator having a wide frequency band, with a relative bandwidth which is defined as (fa-fr)/fr of about 6.5% in the frequency band of about 70 to 200 MHz.

Accordingly, the preferred embodiments of the present invention can provide a resonator suitable for use in the frequency band of about 70 to 200 MHz and having a wide frequency band.

For the purpose of illustrating the invention, there is shown in the drawings several forms which are presently preferred, it being understood, however, that the invention is not limited to the precise arrangements and instrumentalities shown.

DESCRIPTION OF PREFERRED EMBODIMENTS OF THE PRESENT INVENTION

A description will now be given of a preferred embodiment with reference to the drawings.

Figure 1:
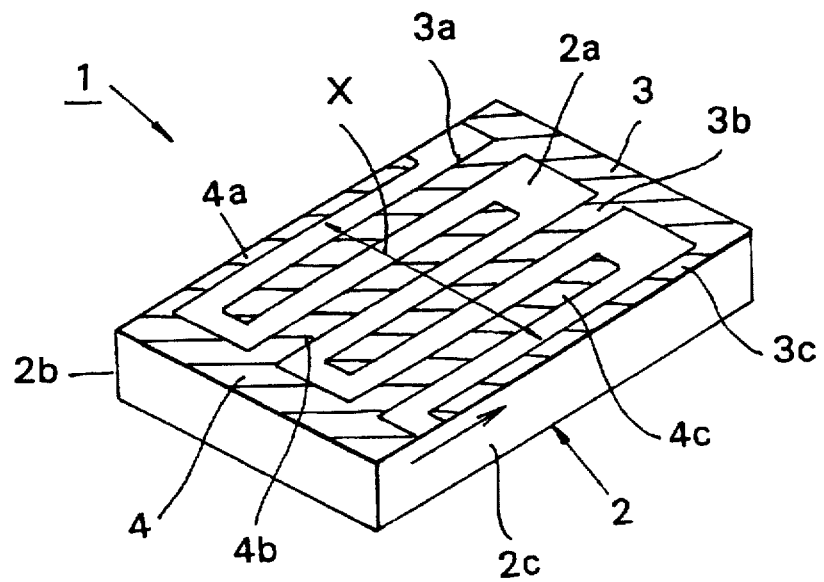
FIG. 1 is a perspective view of a free edge reflective-type surface wave resonator of a preferred embodiment of the present invention.

FIG. 1 is a perspective view of a free edge reflective-type surface wave resonator of a preferred embodiment of the present invention.

Referring to FIG. 1, a free edge reflective-type surface wave resonator is preferably formed by using a substantially rectangular piezoelectric substrate 2. The piezoelectric substrate 2 is preferably made of 41° Y-cut X-propagating piezoelectric single crystals of LiNbO$_3$. An IDT located on the upper surface 2a of the piezoelectric substrate 2 is formed by a pair of comb-like electrodes 3, 4. The comb-like electrodes 3, 4 have a plurality of electrode fingers 3a to 3c and 4a to 4c, respectively.

The electrode fingers 3a to 3c and electrode fingers 4a to 4c are arranged alternatingly with each other. The interval between the plurality of electrode fingers 3a to 4c is preferably substantially equal to ¼ of the wavelength of the leaky wave to be excited. The width of the electrode fingers 3c, 4a located at both edges of the double-headed arrow indicating the directions of propagation of the surface wave is substantially equal to ⅛ of wavelength of the leaky wave, and the width of the remaining electrode fingers 3a, 3b, 4b, and 4c is substantially equal to ¼ of the wavelength of the leaky wave.

The outer edges of the electrode fingers 3c, 4a are formed to extend on the upper surface 2a along a length of the free edges 2c, 2b.

In the free edge reflective-type surface wave resonator 1, application of alternating voltage from the comb-like electrodes 3, 4 produces leaky waves by excitation which propagate in the directions of the double-headed arrow X in FIG. 1. These waves are reflected by two opposing free edges of the piezoelectric substrate 2.

Therefore, the entire surface wave propagation region on the upper surface 2a of the piezoelectric substrate 2 is an excitation region. In other words, there is no region where the surface waves only propagate in the directions of the double-headed arrow X. Therefore, the resonance characteristics of the free edge reflective-type surface wave resonator 1 resulting from the use of leaky waves can be utilized, with almost no decaying influence.

A description will now be given of the specific results of an experiment. The free edge reflective-type surface wave resonator 1 in which a leaky wave having a wavelength λ of 60 μm produced by excitation was prepared by employing a piezoelectric substrate 2 made of Y-cut X-propagating piezoelectric single crystals of LiNbO$_3$ and having a dimension of 2.0 mm×1.0 mm. A pair of comb-like electrodes 3, 4 whose electrode fingers have a pair number N of 15.5 were formed on the piezoelectric substrate 2 by Alminium deposition and patterning. The resonance characteristics of the surface wave resonator is shown in FIG. 2.

Figure 2:
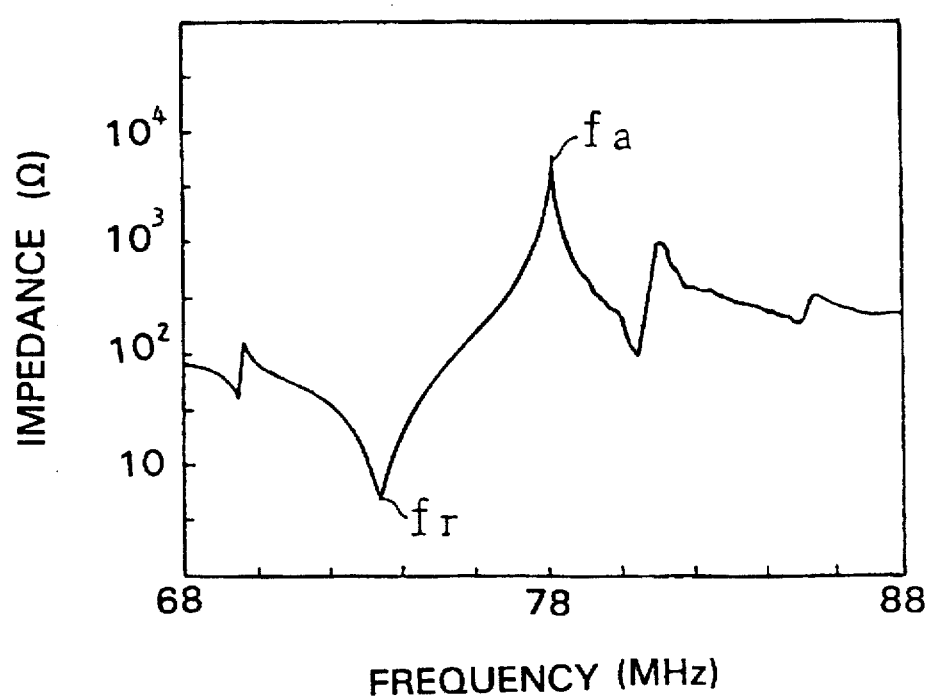
FIG. 2 is an example of a resonance characteristic of the free edge reflective-type surface wave resonator of the preferred embodiment.

As is clear from FIG. 2, the resonance frequency fr is 73.4 MHz, and the antiresonance frequency fa is 78.2 MHz, and thus, Δf=fa–fr=4.8 MHz (Δf/fr=6.5%), so that the resonator has a wide frequency band. It is also clear that the crest-to-trough ratio, that is the ratio of the impedance value at the antiresonance point fa with respect to the impedance value at the resonance point fr is large or about 60 dB.

Another free edge reflective-type surface wave resonator was prepared using the same type of piezoelectric substrate 2 used above. In this resonator, the pair number N of the electrode fingers was 15.5, but the leaky wave produced by excitation had a wavelength λ of 39 μm. The resonance frequency fr is 112.5 MHz, with the difference between the antiresonance frequency and the resonance frequency Δf being 7.3 MHz, so that the resonator exhibits resonance while having a wide frequency band. This resonator also has a large crest-to-trough ratio of 60 dB, which proves that there is almost no decaying influence of the leaky waves.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A free edge reflective-type surface wave resonator utilizing SH-type leaky waves, comprising:

a 41° Y-cut X-propagating piezoelectric substrate made of piezoelectric single crystals of LiNbO$_3$, said piezoelectric substrate having two opposing free edges and a pair of main surfaces connecting said two opposing free edges; and an interdigital transducer located on one of said main surfaces of said piezoelectric substrate and having a pair of comb-like electrodes with a plurality of electrode fingers; wherein said electrode fingers of said pair of comb-like electrodes are arranged alternatingly, with the outer edges of said electrode fingers on both sides indicating the directions of propagation of the surface wave arranged to extend on said one of said pair of main surfaces along a length of said free edges of said piezoelectric substrate, a width of each of said electrode fingers on said both edges being substantially equal to ⅛ of a wavelength of said surface wave and a width of each of the remaining electrode fingers being substantially equal to ¼ of the wavelength of said surface wave.

* * * * *